United States Patent [19]

Okumura

[11] Patent Number: 4,843,518

[45] Date of Patent: Jun. 27, 1989

[54] COAXIAL TYPE CAPACITOR FOR PULSE GENERATOR

[75] Inventor: Mitsunao Okumura, Nagaokakyo, Japan

[73] Assignee: Murata Manufacturing Co., Ltd., Japan

[21] Appl. No.: 171,559

[22] Filed: Mar. 22, 1988

[30] Foreign Application Priority Data

Mar. 23, 1987 [JP] Japan ............................ 62-042928[U]
Dec. 21, 1987 [JP] Japan ............................ 62-194342[U]

[51] Int. Cl.⁴ .......................... H01G 4/38; H03K 3/00
[52] U.S. Cl. ..................................... 361/330; 307/108
[58] Field of Search ................ 307/108, 109; 361/328, 361/330

[56] References Cited

U.S. PATENT DOCUMENTS 3,878,449  4/1975  Wilhelmi et al. ................... 307/108
4,430,577  2/1984  Bouquet ............................. 307/108

Primary Examiner—Donald A. Griffin
Attorney, Agent, or Firm—Ostrolenk, Faber, Gerb & Soffen

[57] ABSTRACT

A coaxial type capacitor for a pulse generator including at least a capacitor for discharging charge accumulated therein upon generating a pulse and a capacitor for adjusting a waveform of a pulse to be outputted.

The coaxial type capacitor includes at least first, second and third capacitors which are arranged coaxially and adjacently with each other. The first and third capacitors between which the second capacitor is arranged are connected in parallel so as to form the discharging capacitor of the pulse generator while the second capacitor is used as the waveform adjusting capacitor of the pulse generator.

10 Claims, 10 Drawing Sheets

COAXIAL TYPE CAPACITOR FOR PULSE GENERATOR

BACKGROUND OF THE INVENTION

1. Field of the Invention

The present invention relates to a coaxial type capacitor suitable for use in a pulse generator which is used for measuring electrical and/or mechanical properties of various electric and electronic devices.

2. Description of the Prior Art

Conventionally, a pulse generator having a structure as shown in FIG. 13 is well known. Namely, in the pulse generator, a discharge gap G to which a capacitor Co and a trigger terminal 1 are connected, a resistor $R_S$ for restraining a high-frequency oscillation generated upon discharge and a discharging resistor $R_O$ are connected so as to form a closed loop, and a capacitor $C_f$ is connected in parallel to the resistor $R_O$ which composes an output circuit together with the capacitor $C_f$. A pulse is generated across the resistor $R_O$ to which a coaxial connecting plug 3 of a coaxial cable 2 is connected for transmitting the generated pulse. The capacitor $C_O$ is charged through a charging resistor Rc by a direct current supplied from a charging terminal 4. Charge accumulated in the capacitor Co is discharged instantly through the discharge gap G, resistors $R_S$ and Ro and the capacitor $C_f$ at the moment that a trigger voltage is applied to the trigger terminal 1 of the discharge gap G and a pulse thus generated is outputted through the coaxial cable 2.

In order to obtain a fast rising property of the pulse, it is desirable to design the pulse generator so as to minimize the dimensions thereof and the total length of wiring. However, in the conventional pulse generator, the discharge gap G is formed with an air gap or a vacuum tube having relatively large dimensions and, further, bulky capacitors of normal type, each of which is housed in a metal case, are used as capacitors Co and Cf, as shown in FIGS. 14(a) and 14(b), and are connected independently according to the wiring diagram shown in FIG. 13. Accordingly, the length of wiring becomes long and this causes the inductance thereof to increase inevitably. As shown in FIG. 15 which shows an equivalent circuit of the pulse generator at the time of discharge of the capacitor Co, a residual inductance L of about 1.0 $\mu$H~3.0 $\mu$H is generated on the way of discharge by the wiring. The residual inductance can be reduced by improving structures of the pulse generator, but it cannot be reduced lower than 0.6 $\mu$H~0.7 $\mu$H. Due to this residual inductance, a high-frequency oscillation is superposed upon a pulse to be outputted and, therefore, the quality of the pulse becomes inferior.

As mentioned above, the resistor $R_S$ is inserted between the discharge gap G and the capacitor $C_f$ for restraining a high-frequency oscillation in the conventional pulse generator assuming that a residual inductance of 1.0 $\mu$H~3.0 $\mu$H is inevitable. However, the resistor $R_S$ must have a high resistance in order to restrain the high-frequency oscillation effectively. Due to this, the rising property waveform of a pulse which is generated by the pulse generator becomes dull and the output impedance the pulse generator becomes high. For reference, the rising time of a pulse is about 1 $\mu$S at the minimum according to the conventional pulse generator.

SUMMARY OF THE INVENTION

One object of the present invention is to provide a coaxial type capacitor suitable for use in a pulse generator.

Another object of the present invention is to provide a coaxial type capacitor which includes both capacitors needed for a circuit of a pulse generator.

A further object of the present invention is to provide a coaxial type capacitor capable of reducing a residual inductance of a pulse generator remarkably.

In order to achieve these objects, according to the present invention, there is provided a coaxial type capacitor for a pulse generator including at least a capacitor for discharging charge accumulated therein upon generating a pulse and a capacitor for adjusting waveform of a pulse to be outputted, being characterized in that said coaxial type capacitor includes first, second and third capacitors which are arranged coaxially and adjacently with each other and that said first and third capacitors arranged in between said second capacitor are connected in parallel so as to from the discharging capacitor of the pulse generator while said second capacitor is used for the waveform adjusting capacitor.

BRIEF DESCRIPTION OF DRAWINGS

These and other objects and features of the present invention will become more apparent when the preferred embodiments of the present invention are described in detail with reference to the accompanied drawings in which.

DETAILED DESCRIPTION OF THE PREFERRED EMBODIMENT

Figure 1:
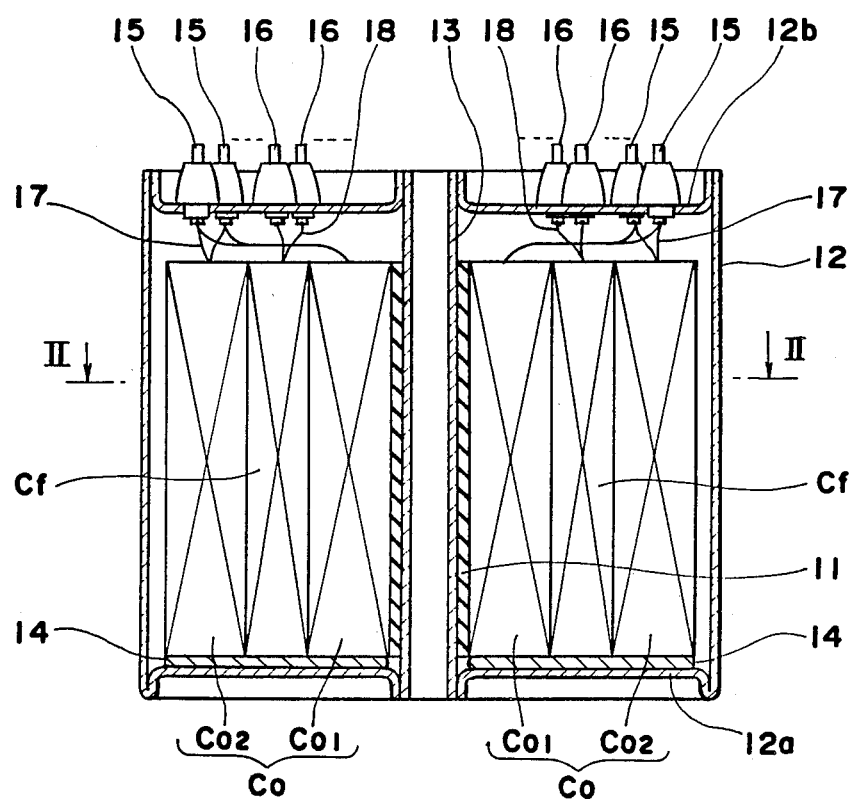
FIG. 1 is a cross sectional view of a coaxial type capacitor according to the present invention.
Figure 2:
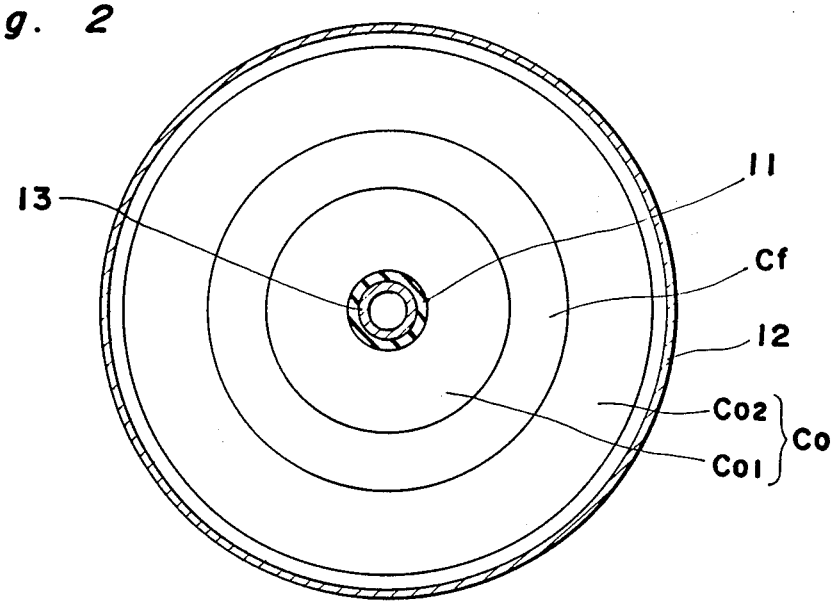
FIG. 2 is a cross sectional view along line II—II of FIG. 1.
Figure 3:
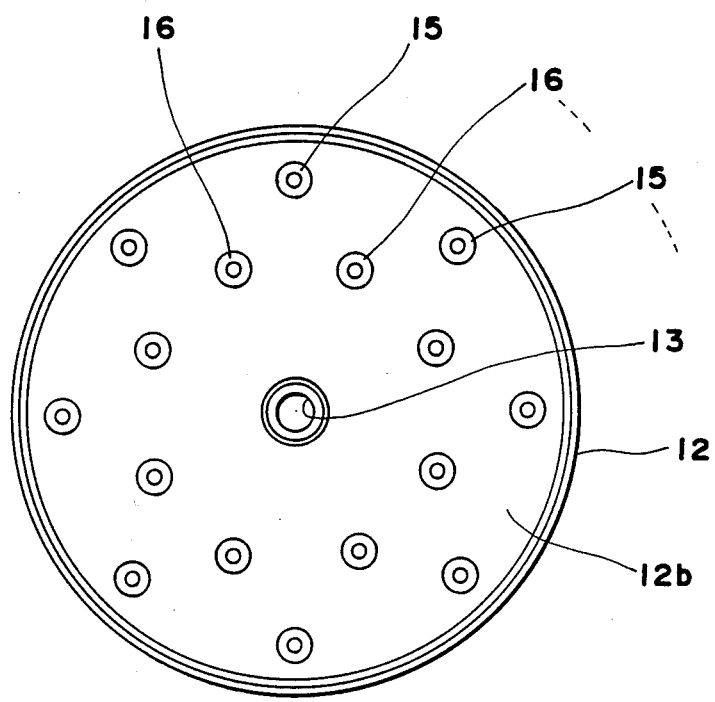
FIG. 3 is a plan view of the coaxial type capacitor shown in FIG. 1.

FIG. 1 shows a vertical cross section of a coaxial type capacitor according to one preferred embodiment of the present invention. FIG. 2 shows a horizontal cross section along line II—II in FIG. 1 and FIG. 3 shows a plan view of the coaxial type capacitor.

The coaxial type capacitor according to the present invention is essentially comprised of three cylindrical film capacitors $C_{O1}$, $C_f$ and $C_{O2}$ having been arranged coaxially. The structure of each film capacitor itself is well known to those skilled in the art.

Figure 13:
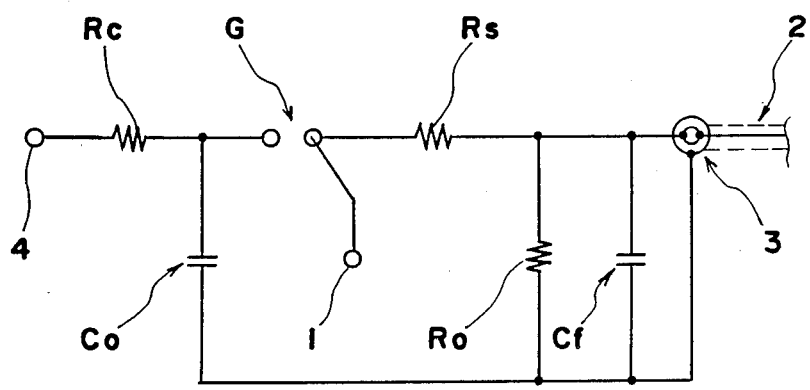
FIG. 13 is an equivalent circuit of a conventional pulse generator.

The inner capacitor $C_{O1}$ fixed around a pipe-like bobbin 11 made of resin and the outer capacitor $C_{O2}$ arranged around the intermediate $C_f$ are connected with each other so as to form one capacitor $C_O$ (hereinafter, referred to the first capacitor Co), which is equivalent to the discharge capacitor Co shown in FIG. 13. The intermediate capacitor $C_f$ (hereinafter referred to the second capacitor) arranged between the inner and outer capacitors $C_{O1}$ and $C_{O2}$ is also equivalent to the capacitor $C_f$ shown in FIG. 8. These three film capacitor $C_{o1}$, $C_f$ and $C_{O2}$ can be made separately and, thereafter, assembled to form a coaxial capacitor unit.

The coaxial capacitor unit comprised of the first and second capacitors Co and Cf is contained in a cylindrical metal case 12. The metal case 12 has a cylindrical pipe 13 coaxially inserted at the center thereof. The bobbin 11 of the inner capacitor $C_{O1}$ is fitted to the pipe 13 from the outside thereof and, thereby, the coaxial capacitor unit is supported by the pipe 13. A respective first electrode of each of the pairs of electrodes of the capacitors $C_{O1}$, $C_f$ and $C_{O2}$ is bonded to a base plate 12a of the metal case 12 with solder 14.

As shown in FIGS. 1 and 3, on a cover plate 12b of the metal case 12, eight output terminals 15 for the first capacitor Co are arranged at a predetermined distance from the center of the plate 12b and at an equal angular pitch and, also, eight output terminals 16 for the second capacitor $C_f$ are arranged inside of the terminals 16 at a constant distance from the center and at an equal angular pitch. To each of the output terminals 16, respective second electrodes of the inner and outer capacitors $C_{O1}$ and $C_{O2}$ are connected by lead wires 17. Also, a second electrode of the intermediate capacitor (the second capacitor) $C_f$ is connected to each of the output terminals 16 by lead wires 18. It is desirable to provide as many respective output terminals 15 and 16 as possible since the residual inductance decreases as the number of the output terminals increased more.

Figure 4:
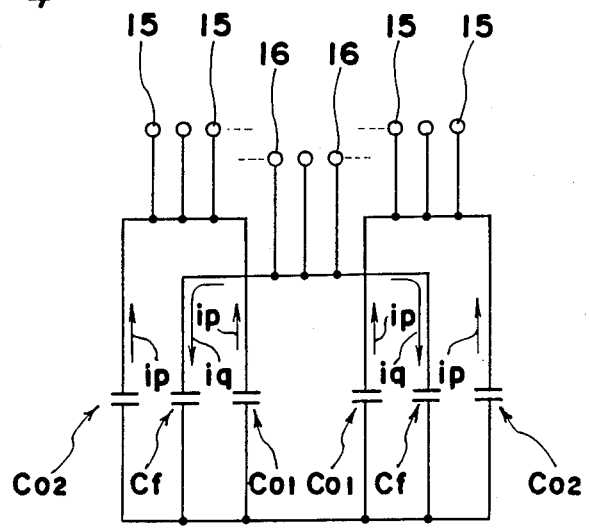
FIG. 4 is an equivalent circuit of the coaxial type capacitor shown in FIG. 1.

FIG. 4 shows an equivalent circuit of the coaxial capacitor according to the embodiment shown in FIGS. 1–3.

First of all, it is to be noted that the direction of the currents ip which are generated upon discharge of the first capacitor Co ($C_{O1}$ and $C_{O2}$) is opposite to the direction of the current iq flowing into the second capacitor $C_f$. Further, it is to be noted that the discharge currents ip generated in the inner and outer capacitor $C_{O1}$ and $C_{O2}$ flow inside and outside of the second capacitor $C_f$ in the opposite direction to the current iq of the latter. Due to these reasons, any inductance caused by the flow path of the discharge current ip is cancelled by that caused by the flow path of the current iq in the second capacitor $C_f$.

Accordingly, the residual inductance can be reduced considerably in the coaxial capacitor according to the present embodiment and, therefore, a pulse generator can generate a pulse of high quality having a fast rising waveform and reduced high frequency oscillation if this coaxial capacitor is employed therein.

According to the present preferred embodiment, the measured residual inductance L is about 20 nH in the case where $C_O = 20$ μF /3KV and $C_f = 0.5$ μF/3KV. In contrast to the above, if a coaxial capacitor comprised of two cylindrical capacitors of 20 μF/3KV and 0.5 μF/3KV is used in place of the coaxial capacitor comprised of three cylindrical capacitors, the measured residual inductance increases to about 30 nH. In other words, the residual inductance of the coaxial capacitor according to the present preferred embodiment of the present invention is reduced by 30% as compared to that of the coaxial capacitor comprised of two cylindrical capacitors.

It is to be noted that capacitors are not restricted to being film capacitors in the present invention as is easily understood from the principle of the present invention.

Figure 5:
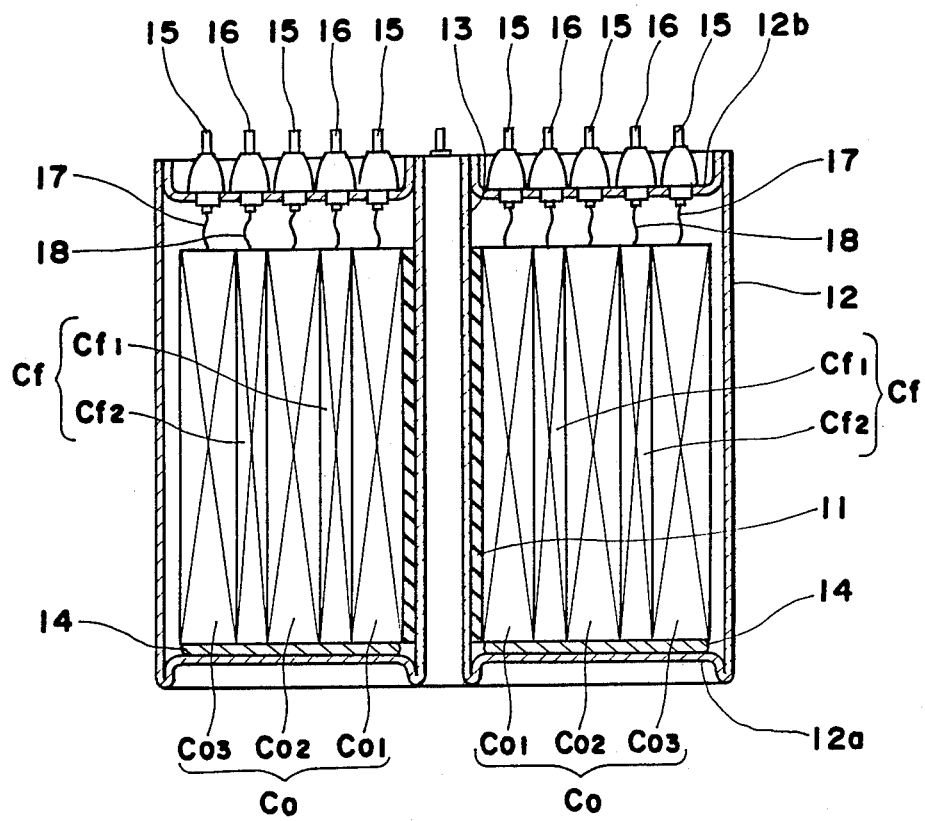
FIG. 5 is a cross sectional view of a coaxial type capacitor according to the second preferred embodiment of the present invention.

FIG. 5 shows another preferred embodiment of the present invention.

In this preferred embodiment, the first capacitor $C_O$ is comprised of three cylindrical capacitors $C_{O1}$, $C_{O2}$ and $C_{O3}$ and the second capacitor $C_f$ is comprised of two cylindrical capacitors $C_{f1}$ and $C_{f2}$ which are inserted between $C_{O1}$ and $C_{O2}$ and between $C_{O2}$ and $C_{O3}$, respectively.

Figure 6:
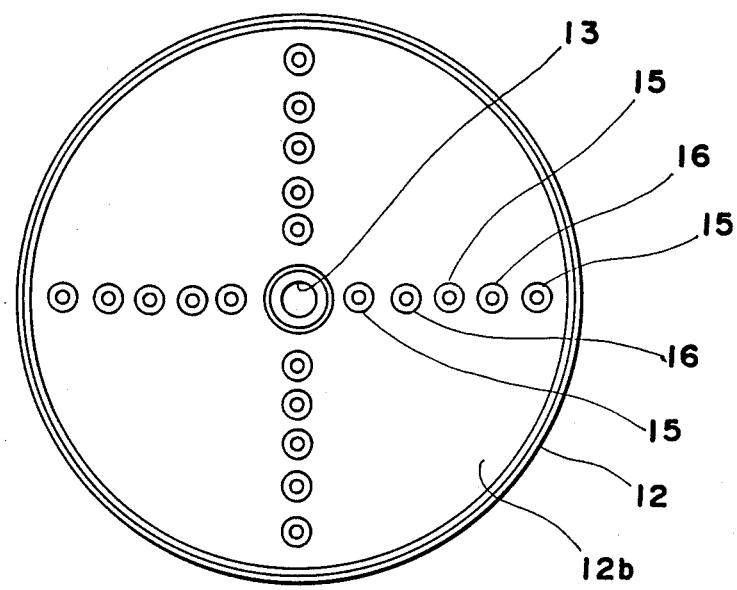
FIG. 6 is a plan view of the coaxial type capacitor shown in FIG. 5.

Further, as shown in FIGS. 5 and 6, in the preferred embodiment, respective output terminals 15 for the first capacitor are arranged on the cover plate 12b so as to be positioned just above the individual capacitors $C_{O1}$, $C_{O2}$ and $C_{O3}$ and respective output terminals 16 for the second capacitor are arranged so as to be positioned just above the individual capacitors $C_{f1}$ and $C_{f2}$. This arrangement for the output terminals contributes to shorten the lead wires of 17, 18 used for connecting the respective capacitors with output terminals 15, 16.

Figure 7:
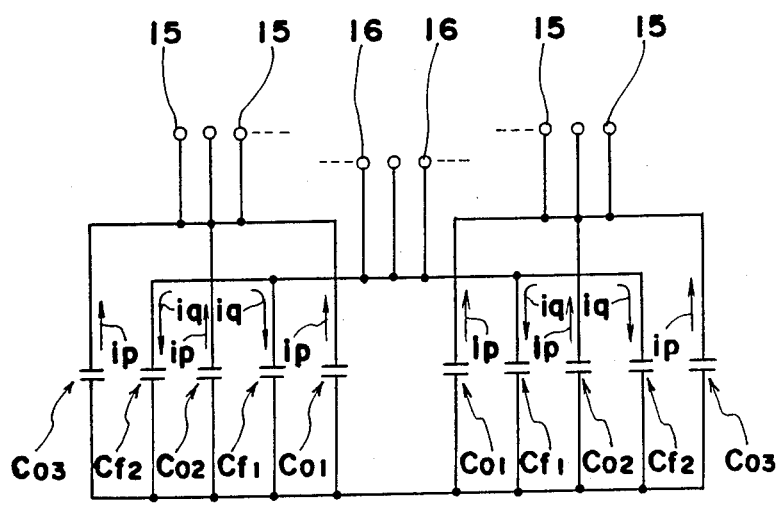
FIG. 7 is an equivalent circuit of the coaxial type capacitor shown in FIG. 5.

As is easily understood from FIG. 7 showing an equivalent circuit of the coaxial capacitor according to the second preferred embodiment of the present invention, the distance between the adjacent respective two currents ip and iq flowing oppositely is shortened and, therefore, the residual inductance L can be reduced further.

According to an experiment made by the inventor of the present invention, the residual inductance L is given by an equation as follows:

$$L = K \frac{30}{N} (nH)$$
K $N$ (nH)

wherein K is a constant falling in a range between 1.2 and 1.5 and N is a number of capacitors which form the first capacitor, namely a number of capacitors into which the first capacitor is divided.

According to this equation, the residual inductance L of the coaxial capacitor shown in FIG. 5 falls in a range defined between 12 and 15 (nH) because N=3 in this case.

Figure 8:
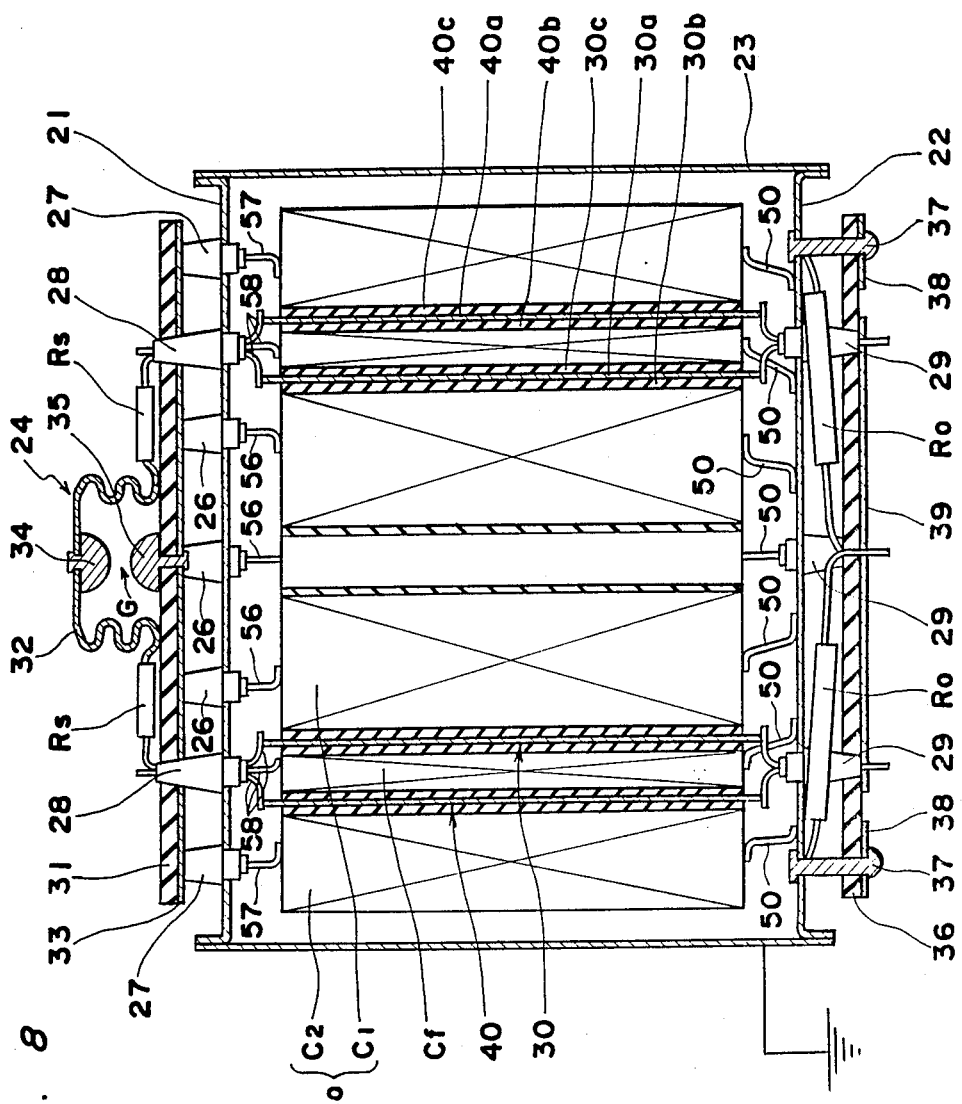
FIG. 8 is a cross sectional view of a pulse generator providing a coaxial type capacitor according to the present invention.

FIG. 8 shows a pulse generator to which the coaxial capacitor according to the present invention is applied.

The pulse generator is essentially comprised of a coaxial capacitor unit formed with three cylindrical capacitor $C_1$, $C_f$ and $C_2$, a metal case 23 providing a cover plate 21 and a base plate 22 in which the capacitor unit is contained, a switch means 24 supported on an upper insulation plate 31 which is supported above the cover plate 21, resistors $R_S$ for restraining a high-frequency oscillation which are mounted on the insulation plate 31 and discharging resisters $R_O$ arranged between the bottom plate 22 and a lower insulation plate 36 supported the bottom plate 22.

The capacitor unit has a structure similar to that of the capacitor unit shown in FIG. 1, namely, the inner capacitor $C_1$ and the outer capacitor $C_2$ form the first capacitor $C_O$ and the intermediate capacitor forms the second capacitor $C_f$. However, in the present capacitor unit, first and second cylindrical elements 30 and 40 are formed between the inner capacitor $C_1$ and the intermediate capacitor $C_f$ and between the intermediate capacitor $C_f$ and the outer capacitor $C_1$, then, a conductive sheet 30a such as a metal sheet is wound around the insulation sheet 30b and, finally, another insulation sheet 30c such as a resin sheet is wound around the conductive sheet 30a. These insulation sheets 30b and 30c are provided for insulating the conductive sheet 30a from the inner capacitor $C_1$ and the intermediate capacitor $C_f$, respectively.

The second cylindrically element 40 is formed similarly. Each conductive sheet 30a or 40a is formed to have such an axial length so that the upper and lower ends thereof can protrude from the upper and lower end surfaces defined by respective capacitors $C_1$, $C_f$ and $C_2$.

It is also desirable to use a conductive sheet laminated with insulation films on both surfaces thereof in order to form the cylindrical element.

Figure 10:
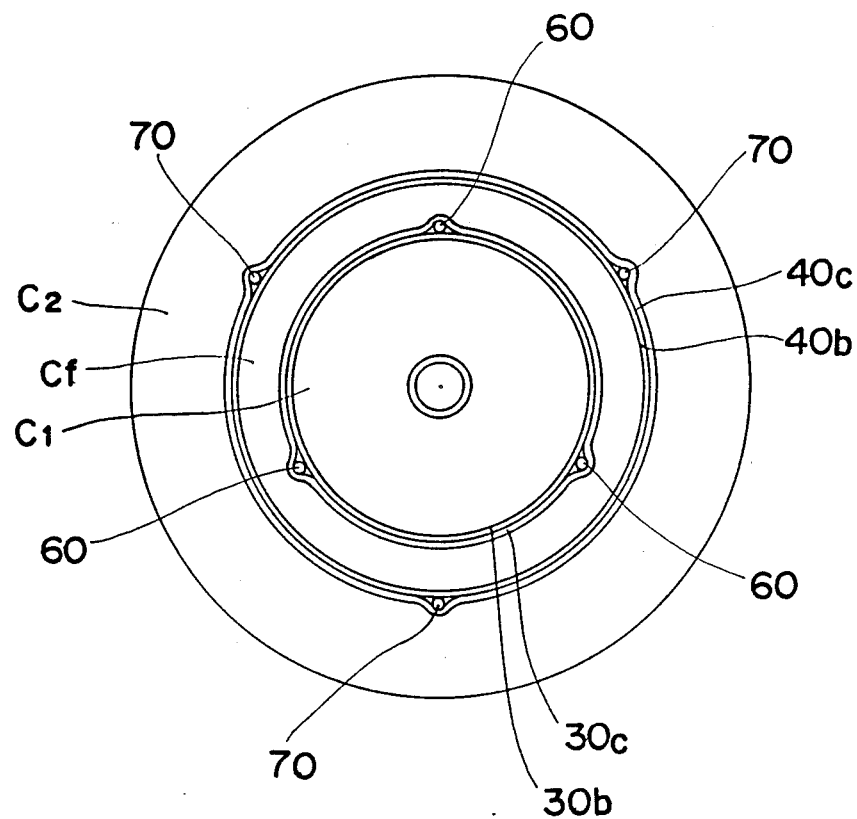
FIG. 10 is a plan view of a capacitor unit according to a variation of the capacitor unit shown in FIG. 8.

Instead of cylindrical elements mentioned above, lead wires are also available. FIG. 10 shows a variation of the capacitor unit shown in FIG. 8. In the variation, three lead wires 60 are inserted between the insulation sheets 30b and 30c at an equal angular pitch (120°) with respect to the center of the unit. Similarly, three lead wires 70 are inserted between the insulation sheets 40b and 40c. These lead wires are also effective to reduce stray capacitors which might be caused if they are not existed. If insulated lead wires are used as these lead wires, respective insulation sheet can be omitted. It is also to be noted that the number of lead wires is not restricted to three as far as lead wires are arranged symmetric with respect to the center of the capacitor unit.

On the cover plate 21, there are radially arranged first, second and third terminals 26, 27 and 28 so as to locate above the inner, outer and intermediate capacitor $C_1$, $C_2$, $C_f$, respectively. Each terminal 26, 27 or 28 is comprised of an insulator cone and a lead wire 56, 57 or 58 passing through the insulator cone. Respective lead wires 56 and 57 of the first and second terminals 26 and 27 are connected to one electrode of the inner and outer capacitors $C_1$ and $C_2$ at respective one end and, respective other ends are connected to a metal plate 33 which is laminated on the lower surface of the first insulation support plate 31. Respective another electrodes of the inner and outer capacitors $C_1$ and $C_2$ are connected to the bottom plate 22 of the metal case 23 by lead wires 50, respectively. As the result of these connection relations mentioned above, the inner and outer capacitors $C_2$ and $C_1$ are connected so as to form the first capacitor $C_0$.

On the contrary to the above, the insulator cone of the third terminal 28 is formed so as to protrude from the upper insulation plate 31 upwardly and the lower end of the lead wire 58 of the third terminal 28 is divided into three so as to connect two upper ends of the cylindrical elements 30 and 40 and one electrode of the second (intermediate) capacitor $C_f$ commonly. Each of lower ends of the cylindrical elements 30 and 40 is connected to a circular electrode plate 39 laminated on the lower surface of the second insulation plate 36 via a lead wire of fourth terminal 29 which is fixed between the bottom plate 22 and the second insulation plate 36. Another electrode of the second capacitor $C_f$ is connected to the bottom plate 22 by lead wires 50.

Another end of the lead wire 58 of the third terminal 28 is connected to a metal bellows 32 of the switch means 24 via the resistor $R_S$. The metal bellows 32 of the switch means 24 supports first discharge electrode 34 of a half-spherical shape so as to oppose with a predetermined gap G against second discharge electrode 35 of a half-spherical shape which is fixed on the center of the first insulation plate 31. The second discharge electrode 35 is connected to the metal plate 33 of the upper insulation plate 31 by a leg portion thereof extending downwardly. Thus, the switch means 24 is switched on when the metal bellows 23 is pushed down.

In place of the flexible metal bellows 32, the first discharge electrode 34 may be supported by a suitable rigid metal element so as to have a gap G between the first and second discharge electrodes 34 and 35. In this case, a trigger electrode (not shown but see FIG. 13) is provided near the first discharge electrode 34 to which a trigger pulse is applied for triggering the switch means 24.

On the contrary to the above, the resistors $R_O$ arranged between the bottom plate 22 and the second insulation plate 36 are connected between the circular metal plate 39 and a metal ring 38 via rivets 37 which support the lower insulation plate 36 from the bottom plate 22. Namely, the metal ring 38 which encircles the circular metal plate 39 with a suitable gap is fixed by the head of rivets 37 on the lower surface of the lower insulation plate 36 and the rivets 37 are connected to the resistors $R_O$ which are connected to the circular metal plate 38 of the lower insulation plate 36. Further, the metal case 23 itself is connected to the earth. Accordingly, an output pulse is outputted between the ring metal plate 38 and the circular plate 39.

Figure 9:
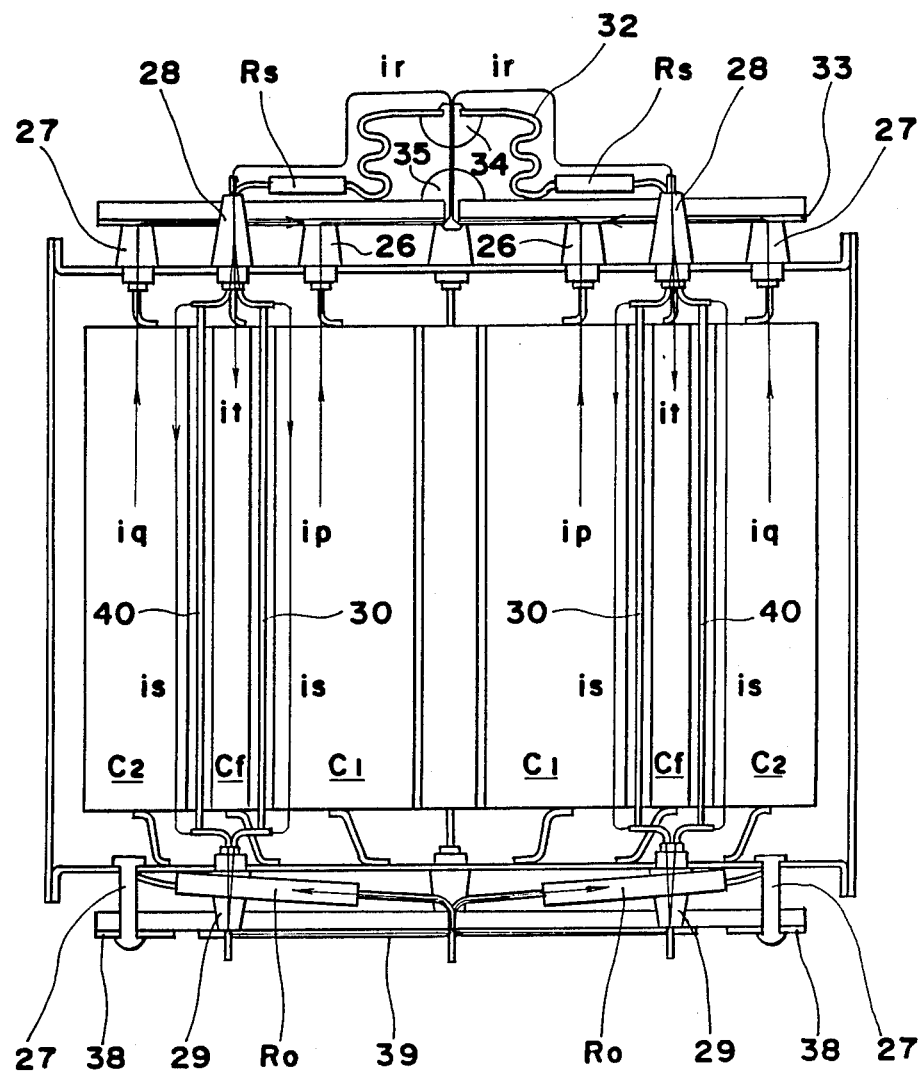
FIG. 9 is an explanatory diagram for showing currents generated in the pulse generator shown in FIG. 8.

In operation of the pulse generator mentioned above, the first capacitor $C_O$ comprised of the inner and outer capacitors $C_1$ and $C_2$ is charged at first by applying a direct voltage thereto through a resistor for charging (not shown). When the switch means 24 is switched on after charging the first capactior $C_O$, charges accumulated in the inner and outer capacitor $C_1$ and $C_2$ is discharged to generates currents ip and iq, respectively, as shown in FIG. 9. These currents ip and iq flow through the first and second terminals 26 and 27, the metal plate 33 and the switch means 24 to form a total discharge current $i_y$. The total discharge current $i_y$ flows into the resistors $R_S$ and, then, via the third terminals 28, flows dividedly into the second capacitor $C_f$ and the inner and outer cylindrical elements 30 and 40. Namely, current $i_t$ flows through the second capacitor $C_f$ and respective currents $i_s$ flow through the inner and outer cylindrical elements 30 and 40. The currents $i_s$ flow via the fourth terminals 29, and the circular metal plate 39, into the resistors $R_O$. Thus, an output pulse is outputted between the circular metal plate 39 and the ring metal plate 38.

As is clearly shown in FIG. 9, the directions of the currents ip and iq are opposite to those of the currents $i_s$ and $i_t$ and these currents are concentric with each other. Accordingly, inductances induced on flow paths of the currents ip and iq are cancelled with inductances induced on flow paths of the currents $i_s$ and $i_t$. This reduces a residual inductance of the pulse generator together with an output impedance thereof. Therefore, a pulse of high quality having a first rising time but including no high-frequency oscillation can be obtained by minimizing the value of the resistor $R_S$ as small as possible while maintaining the role thereof for restraining high-frequency oscillation.

Merits obtained by two cylindrical elements 30 and 40 will be explained with use of FIGS. 11 and 12.

Figure 11A:
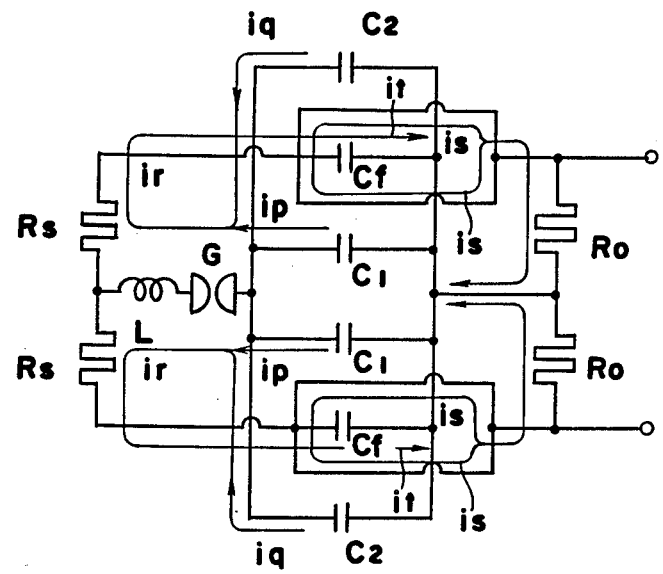
FIG. 11(a) is an equivalent circuit of the pulse generator shown in FIG. 8.
Figure 12A:
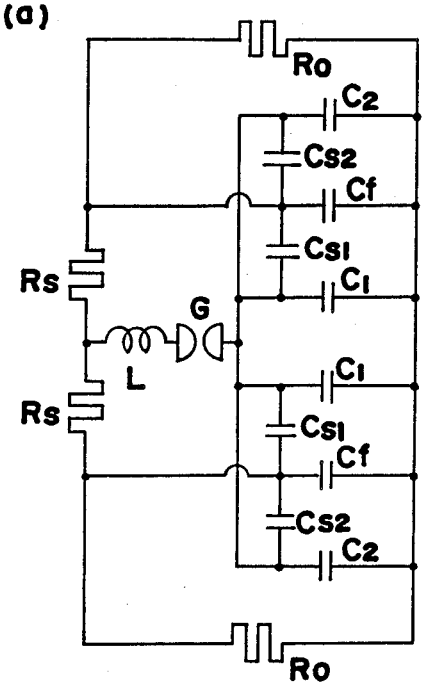
FIG. 12(a) is an equivalent circuit of a pulse generator wherein no cylindrical element is used.

FIG. 11(a) shows an equivalent circuit of a pulse generator wherein two cylindrical elements are used according to the preferred embodiment as shown in FIG. 8. FIG. 12(a) shows an equivalent circuit of a pulse generator wherein no such cylindrical element is used.

Figure 11B:
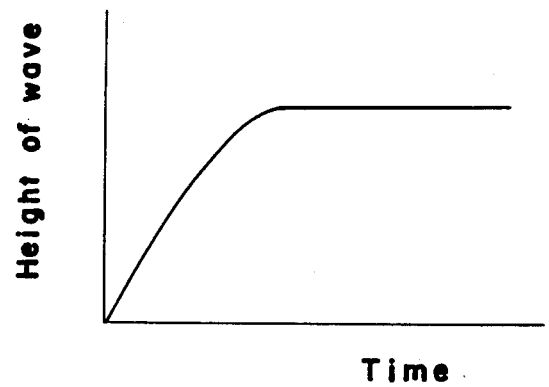
FIG. 11(b) is a graph for showing an output pulse generated by the pulse generator according to the present invention.

As shown in FIG. 11(a), in the pulse generator with two cylindrical elements, no stray capacity is induced and, therefore, an output pulse rises smoothly as shown in FIG. 11(b).

Figure 12B:
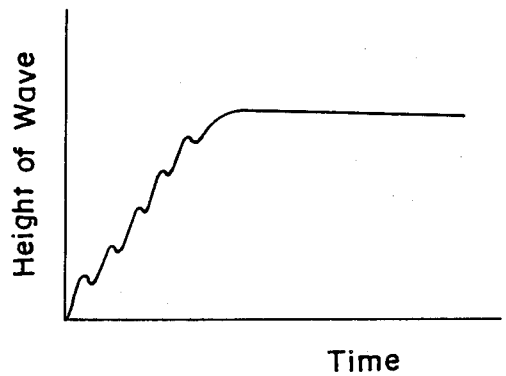
FIG. 12(b) is a graph for showing an output pulse generated by the pulse generator having the equivalent circuit shown in FIG. 12(a)
Figure 14:
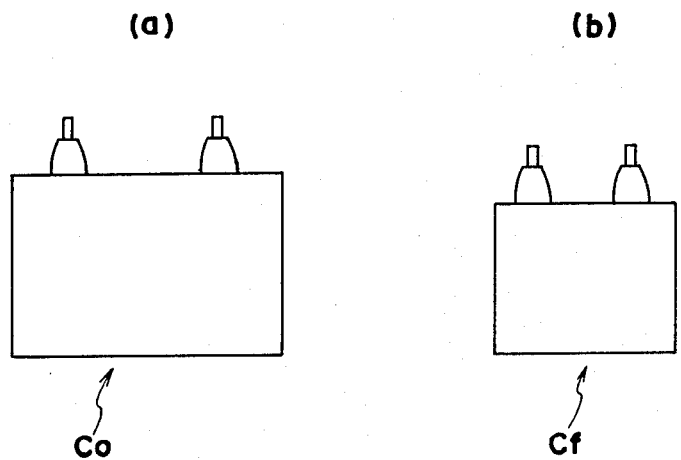
FIGS. 14(a) and 14(b) are side-elevational views for showing capacitors $C_O$ and $C_f$ used in a conventional pulse generator.
Figure 15:
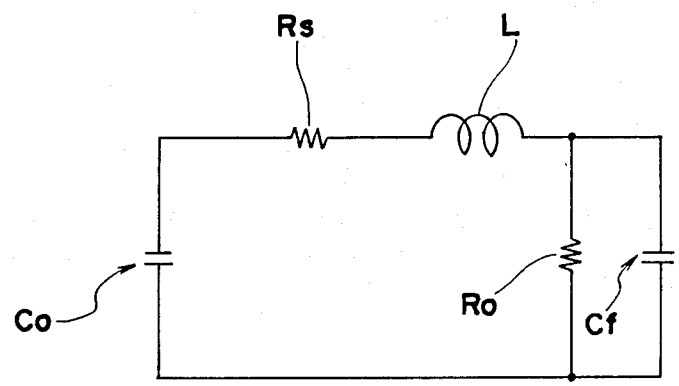
FIG. 15 is an equivalent circuit of a conventional pulse generator for showing a residual inductance generated upon discharge of the capacitor $C_O$.

Contrary to the above, in the example of FIG. 12(a), two stray capacitors $C_{S1}$ and $C_{S2}$ are induced. Due to such stray capacity, a high-frequency oscillation is generated upon rise of the pulse as shown in FIG. 12(b).

The pulse generator according to the preferred embodiment of the present invention shows a residual inductance smaller than one-hundredth of that of a conventional pulse generator and a rising time smaller than one-tenth of the latter.

The preferred embodiments described herein are illustrative and not restrictive, the scope of the invention being indicated by the appended claims and all variations which come within the meanings of the claims are intended to be embraced herein.

What is claimed is:

1. A coaxial type capacitor for a pulse generator including at least a first capacitor for discharging charge accumulated therein when a pulse is generated and a second capacitor for adjusting a waveform of a pulse to be outputted,
   wherein said coaxial type capacitor includes at least first, second and third capacitors which are arranged coaxially and adjacently with each other,
   wherein said first and third capacitors between which said second capacitor is arranged are connected in parallel so as to form the discharging capacitor of the pulse generator while said second capacitor is used as the waveform adjusting capacitor, and
   wherein currents in said first and third capacitors flow oppositely in direction to that of a current in said second capacitor when a pulse is generated.

2. A coaxial type capacitor for a pulse generator according to claim 1, wherein said first, second and third capacitors are cylindrical capacitors.

3. A coaxial type capacitor for a pulse generator according to claim 1, wherein said first, second and third capacitors are film capacitors.

4. A coaxial type capacitor for a pulse generator according to claim 1, further including a metal shield case for containing said first, second and third capacitors in a shielded state.

5. A coaxial type capacitor for a pulse generator according to claim 4, wherein said metal shield case is comprised of a cylindrical body having a bottom plate, a central pipe which is fixed concentric with said cylindrical body, and a cover plate for covering an upper aperture of said cylindrical body.

6. A coaxial type capacitor for a pulse generator according to claim 5, wherein a plurality of insulator cones are arranged radially on said cover plate through which respective lead wires are led out and each of the lead wires is connected to one of said first, second and third capacitors.

7. A coaxial type capacitor for a pulse generator according to claim 1, further including at least one conductive element which is put in an insulated state at least between said first and second capacitors or between said second and third capacitors and said at least one conductive element is connected commonly to respective electrodes of said second capacitor.

8. A coaxial type capacitor for a pulse generator according to claim 7, wherein said conductive element is a conductive sheet wound cylindrically.

9. A coaxial type capacitor for a pulse generator according to claim 7, wherein said conductive element is comprised of a plurality of lead wires arranged at an equal angular pitch with respect to the center of the coaxial type capacitor.

10. A coaxial type capacitor for a pulse generator including at least a first capacitor for discharging change accumulated therein when a pulse is generated and a second capacitor for adjusting a waveform of a pulse to be outputted,
    wherein said coaxial type capacitor includes first to fifth capacitors which are arranged coaxially with each other in that order,
    wherein said first, third and fifth capacitor are connected in parallel with each other to form the discharging capacitor of the pulse generator,
    wherein said second and fourth capacitors are connected in parallel with each other to form the waveform adjusting capacitor, and
    wherein currents in said first, third and fifth capacitors flow in a direction opposite to the direction of currents in said second and fourth capacitors when a pulse is generated.

* * * * *